(12) United States Patent
Van Der Net (10) Patent No.: US 9,004,459 B2
(45) Date of Patent: Apr. 14, 2015

(54) HUMIDIFYING APPARATUS, LITHOGRAPHIC APPARATUS AND HUMIDIFYING METHOD

(75) Inventor: Antonius Johannus Van Der Net, Tilburg (NL)

(73) Assignee: ASML Netherlands B.V., Veldhoven (NL)

(*) Notice: Subject to any disclaimer, the term of this patent is extended or adjusted under 35 U.S.C. 154(b) by 23 days.

(21) Appl. No.: 12/959,953

(22) Filed: Dec. 3, 2010

(65) Prior Publication Data

US 2011/0074053 A1    Mar. 31, 2011

Related U.S. Application Data

(63) Continuation of application No. 11/710,428, filed on Feb. 26, 2007, now Pat. No. 7,866,637, which is a continuation of application No. PCT/GB2007/000278, filed on Jan. 26, 2007.

(51) Int. Cl.
| | |
|---|---|
| *B01F 3/04* | (2006.01) |
| *G03F 7/20* | (2006.01) |
| *C10J 1/06* | (2006.01) |
| *C10J 1/10* | (2006.01) |

(52) U.S. Cl.
CPC .............. *G03F 7/70933* (2013.01); *C10J 1/06* (2013.01); *C10J 1/10* (2013.01); *G03F 7/70341* (2013.01); *Y10S 261/65* (2013.01)

(58) Field of Classification Search
CPC ........... C10J 1/06; C10J 1/10; G03F 7/70341; G03F 7/70933; Y10S 261/65
USPC ......... 261/104, 107, 128, 129, 130, 131, 136, 261/DIG. 65; 355/30
See application file for complete search history.

(56) References Cited

U.S. PATENT DOCUMENTS

| | | | |
|---|---|---|---|
| 4,098,852 A * | 7/1978 | Christen et al. ............ | 261/104 |
| 4,101,294 A * | 7/1978 | Kimura ...................... | 48/77 |
| 4,355,636 A | 10/1982 | Oetjen et al. | |
| 4,367,734 A | 1/1983 | Benthin | |
| 4,381,267 A | 4/1983 | Jackson | |
| 4,509,852 A | 4/1985 | Tabarelli et al. | |
| 5,273,689 A | 12/1993 | Hamasaki | |
| 5,348,691 A | 9/1994 | McElroy et al. | |
| 5,368,786 A * | 11/1994 | Dinauer et al. ............ | 261/130 |
| 5,653,920 A | 8/1997 | DiDomenico | |

(Continued)

FOREIGN PATENT DOCUMENTS

| | | |
|---|---|---|
| EP | 1420298 | 5/2004 |
| EP | 1420300 | 5/2004 |

(Continued)

OTHER PUBLICATIONS

Japanese Office Action in related application No. 2008-012414, mailed Aug. 20, 2010.

(Continued)

*Primary Examiner* — Charles Bushey
(74) *Attorney, Agent, or Firm* — Pillsbury Winthrop Shaw Pittman LLP (57) ABSTRACT

A humidifying apparatus is disclosed in which gas is provided to a first side of a membrane and liquid to a second side of the same membrane. The membrane is non-porous to the liquid but porous to vapor of the liquid and is liquidphilic to said liquid.

20 Claims, 5 Drawing Sheets

(56) References Cited

U.S. PATENT DOCUMENTS

| | | | |
|---|---|---|---|
| 5,738,808 A | 4/1998 | Iwamoto | |
| 6,158,721 A | 12/2000 | Katou et al. | |
| 6,896,247 B2 * | 5/2005 | Brotzeller et al. | 261/128 |
| 7,051,733 B2 * | 5/2006 | Gradon et al. | 128/203.17 |
| 7,585,355 B2 * | 9/2009 | Gonjo et al. | 96/9 |
| 2002/0124431 A1 | 9/2002 | Duhaut et al. | |
| 2004/0245658 A1 | 12/2004 | Niland et al. | |
| 2005/0051739 A1 | 3/2005 | Van Der Net et al. | |
| 2006/0033898 A1 | 2/2006 | Cadee et al. | |
| 2006/0158627 A1 | 7/2006 | Kemper et al. | |
| 2006/0205301 A1 | 9/2006 | Klare et al. | |
| 2006/0285091 A1 | 12/2006 | Parekh et al. | |
| 2006/0285096 A1 | 12/2006 | Jacobs et al. | |
| 2008/0179765 A1 | 7/2008 | Van Der Net | |

FOREIGN PATENT DOCUMENTS

| | | |
|---|---|---|
| EP | 1 610 361 | 12/2005 |
| JP | 7-243675 | 9/1995 |
| JP | 10-197016 | 7/1998 |
| JP | 2002-075423 | 3/2002 |
| JP | 2005337640 | 8/2005 |
| JP | 2006-332100 | 12/2006 |
| JP | 2006528431 | 12/2006 |
| JP | 2007-005795 | 1/2007 |
| WO | 99/49504 | 9/1999 |
| WO | 2004-090634 | 10/2004 |
| WO | 2005/010619 | 2/2005 |
| WO | 2006-003373 | 1/2006 |
| WO | 2006-093340 | 9/2006 |

OTHER PUBLICATIONS

Japanese Office Action mailed Dec. 13, 2010 in related Japanese patent application No. 2008-012414.

* cited by examiner

Fig. 8

HUMIDIFYING APPARATUS, LITHOGRAPHIC APPARATUS AND HUMIDIFYING METHOD

RELATED APPLICATIONS

This application is a continuation of U.S. patent application Ser. No. 11/710,428, filed Feb. 26, 2007, now U.S. Pat. No. 7,866,637, which is a continuation of PCT Patent Application No. PCT/GB2007/00278 filed Jan. 26, 2007, the entire contents of each of the foregoing applications is hereby incorporated by reference.

FIELD

The present invention relates to a humidifying apparatus and a humidifying method for use in combination with a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852) means that there is a large body of liquid that must be accelerated during a scanning exposure. This requires additional or more powerful motors and turbulence in the liquid may lead to undesirable and unpredictable effects.

Figure 2:
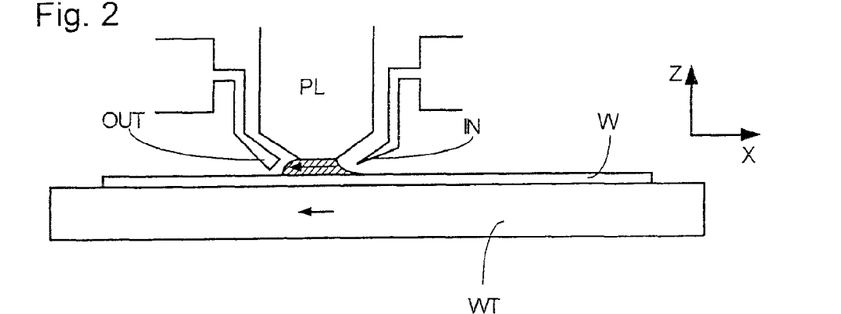
FIGS. 2 and 3 depict a liquid supply system used in a prior art lithographic projection apparatus.
Figure 3:
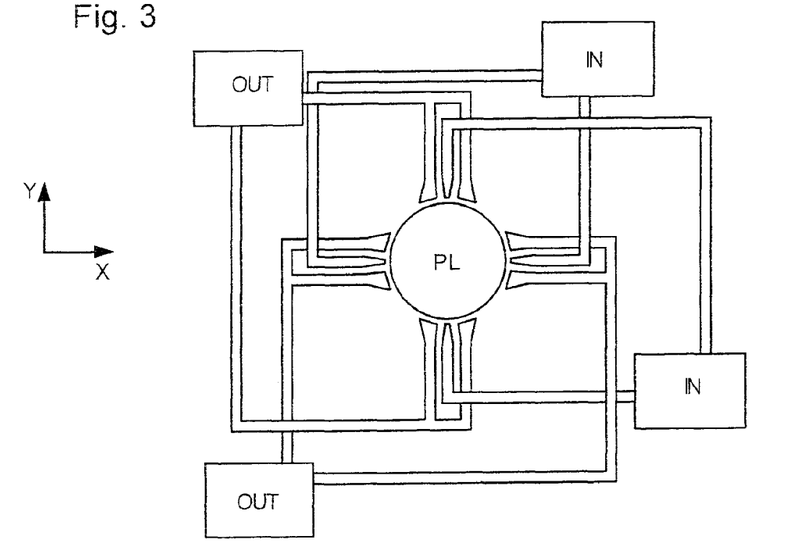

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
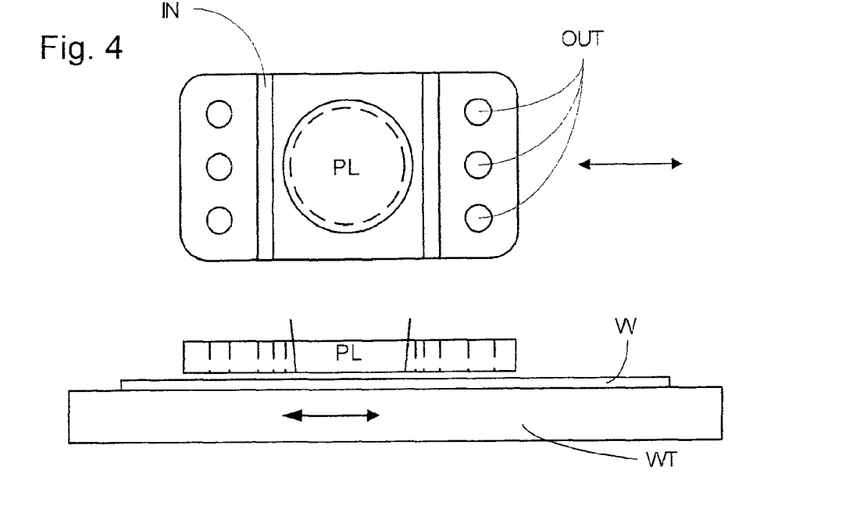
FIG. 4 depicts a liquid supply system according to another prior art lithographic projection apparatus.
Figure 5:
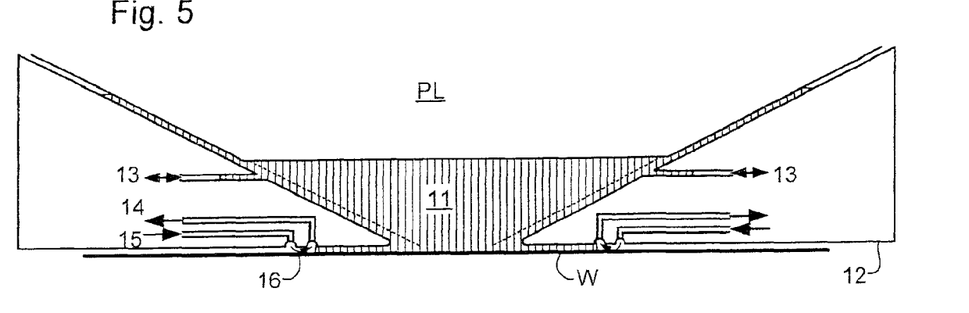
FIG. 5 depicts, in cross-section, a liquid supply system of an immersion lithographic projection apparatus.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal to confine the liquid. Such as system with a gas seal is disclosed in EP-A-1,420,298 and illustrated in FIG. 5.

In EP-A-1,420,300 the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

Many of the modules used in an immersion lithographic apparatus require the use of a purge gas. For example, a gas might be needed in a liquid confinement system or might be needed in other systems such as drying systems. In order to reduce cooling effects due to evaporation by use of a purge gas (which can have quite a high flow rate) it is useful to use humidified gas. Currently humidified gas which has a relative humidity of 45-85% is used. In future systems it will be necessary to use humidified gas with a humidity level which is higher, up to 97% relative humidity. The use of a high humidity gas reduces evaporation. Another area where high humidity gas is required is in use in so called "all wet" immersion systems in which the whole top surface of the substrate is submerged by water during imaging of the substrate. In order to prevent deleterious temperature variations due to evaporation of the water covering the substrate a high humidity gas is purged over the water surface so that the air above the water surface is close to saturation thereby eliminating evaporation. If it were not for the provision of this purging gas, a large amount of water would be needed in order to keep the temperature stable at normal evaporation rates.

SUMMARY

It is desirable to provide a method and apparatus for the humidifying of gas.

According to an aspect of the invention, there is provided a humidifying apparatus comprising: a membrane; a first conduit for guiding gas to one side of said membrane; a second conduit for guiding liquid to the other side of said membrane; wherein said membrane has a surface which is liquidphilic to said liquid.

According to an aspect of the invention, there is provided a humidifying apparatus comprising: a membrane; a liquid temperature conditioner for conditioning the temperature of a liquid; a liquid conduit for guiding liquid from said liquid temperature conditioner to one side of said membrane; and a gas conduit for guiding gas to the other side of said membrane; wherein the temperature of said gas on the other side of said membrane is influenced by the temperature of liquid on the one side of said membrane.

According to an aspect of the invention, there is provided a method of humidifying gas comprising: providing a liquid on one side of a membrane which membrane is liquidphilic to said liquid; and providing a gas to be humidified on the other side of said membrane.

According to an aspect of the invention, there is provided a method of humidifying gas comprising: controlling the temperature of a liquid and providing that liquid to one side of a membrane; and providing gas to be humidified to the other side of said membrane, wherein the temperature of gas on the other side of said membrane is influenced by the temperature of liquid on the one side of the membrane.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
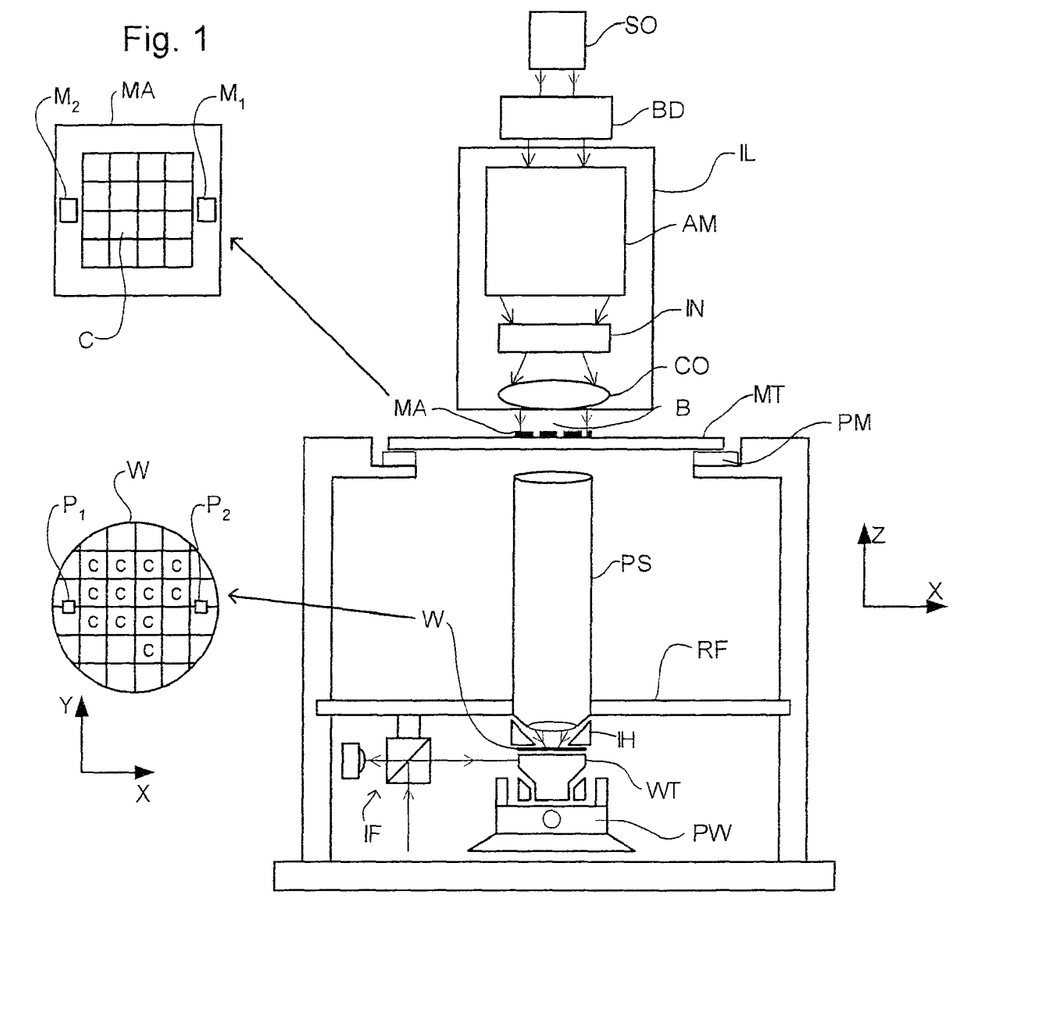
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The use of higher and higher flow rates of gas in immersion lithography apparatus, particularly in liquid confinement systems but also in other systems such as drying stations can lead to fast evaporation of immersion liquid from, for example, the substrate. This high evaporation rate leads to cooling and deleteriously effects the performance of the apparatus. Another area where high humidity gas is required is in use in so called "all wet" immersion systems in which the whole top surface of the substrate is submerged by water during imaging of the substrate. In order to prevent deleterious temperature variations due to evaporation of the water covering the substrate a high humidity gas is purged over the water surface so that the air above the water surface is close to saturation thereby eliminating evaporation. If it were not for the provision of this purging gas, a large amount of water would be needed in order to keep the temperature stable at normal evaporation rates. Also, increasing flow rates of humidified gas are necessary to minimize the disturbance for all optical sensors (examples: level sensor purging, encoder sensor purging etc.). These increased flows therefore require a more efficient humidifying apparatus.

Figure 6:
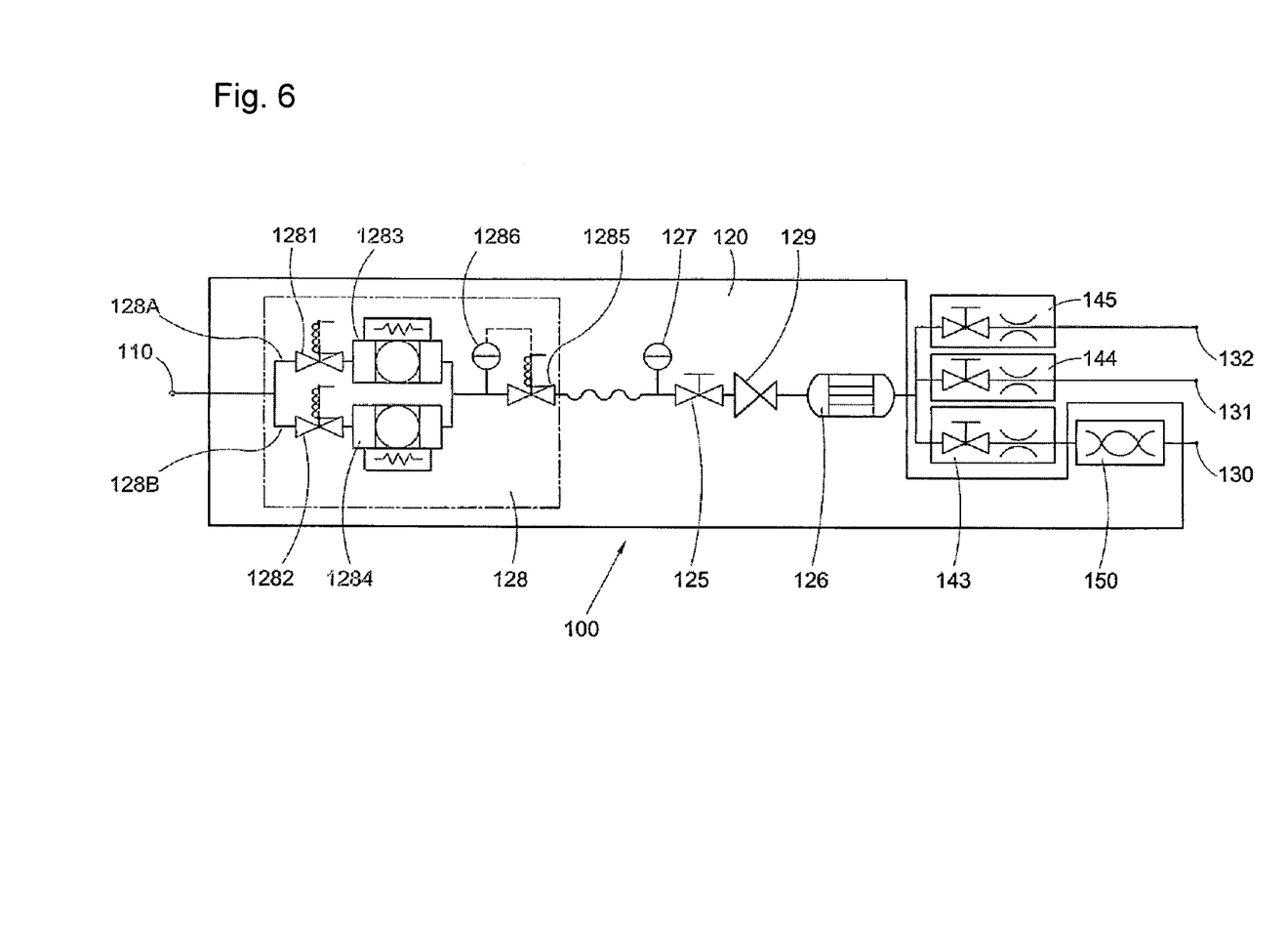
FIG. 6 depicts schematically a circuit diagram of an example of a purge gas supply system according to the invention.

FIG. 6 illustrates a general purge gas supply system which might be used in an immersion lithographic apparatus. Such a system is described in detail in US 2005/0051739 and reference is made to that document.

FIG. 6 shows a practical example of a purge gas supply system 100. However, a similar system as shown in FIG. 6 may likewise be utilized in conditioning gas used in gas bearings in e.g. an immersion lithography apparatus. In the example of FIG. 6, a purge gas inlet 110 is connected to a, not shown, purge gas supply apparatus which supplies a dry gas which is substantially without moisture, such as, for example, a pressurised gas supply circuit, a cylinder with compressed dry air or otherwise. The dry gas is fed through the purge gas mixture generator 120. In the purge gas mixture generator 120 the dry gas is purified further, as is explained below in more detail. Further, the purge gas mixture generator 120 includes a humidifying apparatus 150 which adds a moisture to the dry gas, for some of the purge gas outlets 130-132. In the example of FIG. 6, the humidifying apparatus 150 is connected a single purge gas outlet 130. The other purge gas outlets 131, 132 are not connected to the humidifying apparatus 150. Thus, at the purge gas outlet 130, a purge gas mixture including the purge gas and moisture is presented, whereas at the other purge gas outlets 131,132 only the dry purge gas is presented. Thereby the purge gas mixture may be provided only near surfaces provided with chemicals which require a moisture, such as the substrate table WT in the example of FIG. 1, whereas other parts of the lithographic projection apparatus 1 can be provided with a 'dry' purge gas, i.e., without moisture. However, the main reason for use of humidified purge gas is not to disturb measurement systems (in particular for non immersion lithographic projection apparatus).

Furthermore, because the moisture is added to a purge gas, properties of the purge gas mixture, such as the relative humidity or purity of the moisture, can be controlled with a good accuracy. Also, because of the moisturizer the system is flexible, because the amount of moisture present in the purge gas mixture may easily be adjusted by adding more or less moisture to the purge gas.

The purge gas mixture generator 120 in the example of FIG. 6 includes, in a flow direction and that order: a purifier apparatus 128, a flow meter 127, a valve 125, a reducer 129, a heat exchanger 126 and a humidifying apparatus 150.

In the example of FIG. 6, compressed dry air (CDA) from a, not shown, CDA source is supplied to the purifier apparatus 128 via the purge gas inlet 110. The CDA is purified by the purifier 128. The purifier 128 includes two parallel flow branches 128A, 128B each including, in the flow direction and that order: an automatic valve 1281, 1282 and a regenerable purifier device 1283,1284. The regenerable purifier devices 1283,1284 are each provided with a heating element to heat and thereby regenerate the respective purifier device 1283, 1284. The flow branches are connected downstream of the purifier devices 1283, 1284 to a shut-off valve 1285 which is controlled by a purity sensor 1286.

Because of the regenerable purifiers, the system can be used for a long time period by regenerating the purifiers in case they become saturated with the compounds removed from the purge gas. The regenerable purifiers may be of any suitable type, such as for example a, known as such, regenerable filter which removes contaminating compounds or particles out of a gas by means of a physical process, such as adsorption, catalysis or otherwise, as opposed to the, non regenerable, chemical processes occurring in a charcoal filter, for example. In general, a regenerable purifier does not contain organic material and the regenerable purifiers may for example contain a material suitable for physical binding a contaminant of the purge gas, such as for example: metals, zeolite, titanium oxides, gallium or palladium compounds, or otherwise.

In the example of FIG. 6, the purifier devices 1283, 1284 are alternately put in a purifying state in which the CDA is purified and a regenerating state. In the regenerating state the purifier device is regenerated by means of the respective heating element. Thus, for example, while the purifier device 1283 purifies the CDA, the purifier device 1284 is regenerated. The purifier 128 can thus operate continuously while maintaining a constant level of purification.

The automatic valves 1281, 1282 are operated in correspondence with the operation of the corresponding purifier device 1283, 1284. Thus, when a purifier device 1283, 1284 is regenerated, the corresponding valve 1281, 1282 is closed, while when a purifier device 1283, 1284 is used to purify, the corresponding valve is open.

The purified CDA is fed through the shut-off valve 1285 which is controlled by the purity sensor 1286, which is known per se and for the sake of brevity is not described in further detail. The purity sensor 1286 automatically closes the shut-off valve 1285 when the purity of the purified CDA is below a predetermined threshold value. Thus, contamination of the lithographic projection apparatus 1 with a purge gas with insufficient purity levels is prevented automatically.

The flow of purified CDA can be monitored via the flow meter 127. Via the valve 125 the flow can be shut-off manually. The reducer 129 provides a stable pressure at the outlet of the reducer, thus a stable purge gas pressure is provided to restrictions (via the heat exchanger 126).

The heat exchanger 126 provides a constant purified CDA temperature. The heat exchanger 126 extracts or adds heat to the purified CDA in order to achieve a gas temperature which is suitable for the specific implementation. In a lithographic projection apparatus, for example, stable processing conditions are required and the heat exchanger may thus stabilize the temperature of the purified CDA to have a gas temperature which is constant over time. Suitable conditions for the purge gas at the purge gas outlets, for example, are found to be: a flow of 50-60 standard liters per minute, (for immersion systems typically 60-120 standard liters per minute when the gas is used for liquid confinement, 100-120 standard liters per minute when used to prevent evaporation of water covering the substrate and/or a temperature of the purge gas of about 22 degrees Celsius and/or a relative humidity in the range of 30-99%. However, the invention is not limited to these conditions and other values for these parameters may likewise be used in a system according to the invention.

The heat exchanger 126 is connected via restrictions 143-145 to the purge gas outlets 130-132. The restrictions 143-145 limit the gas flow, such that at each of the purge gas outlets 130-132 a desired, fixed purge gas flow and pressure is obtained. A suitable value for the purge gas pressure at the purge gas outlets is for example 100 mbar. It is likewise possible to use adjustable restrictions to provide an adjustable gas flow at each of the purge gas outlets 130-132.

The humidifying apparatus 150 is connected downstream from the heat exchanger between the restriction 143 and the purge gas outlet 130. The purge gas outlet 130 is provided in the example of FIGS. 1 and 2 near the substrate table WT. The humidifying apparatus 150 adds a moisture to the purified CDA and thus provides a purge gas mixture to the outlet 130. In this example, only at a single outlet a purge gas mixture is discharged. However, it is likewise possible to discharge a purge gas mixture to two or more purge gas outlets, for example by connecting a multiple of purge gas outlets to separate moisturizers or connecting two or more outlets to the same moisturizer. It is likewise possible to provide a moisturizer at a different position in the purge gas mixture generator than is shown in FIG. 6. For example, the humidifying apparatus 150 may be placed between the purge gas mixture generator 120 and the valve 143 instead of between the valve 143 and the purge gas outlet 130. The humidifying apparatus 150 may operate as a restriction as well and if so desired, the restriction 143 connected to the humidifying apparatus 150 may be omitted.

In an alternative embodiment of a purge gas supply system according to the invention, an additional heat exchanger (not shown) is provided at the purge gas outlet 130 for a better temperature control of the purge gas mixture.

Figure 7A:
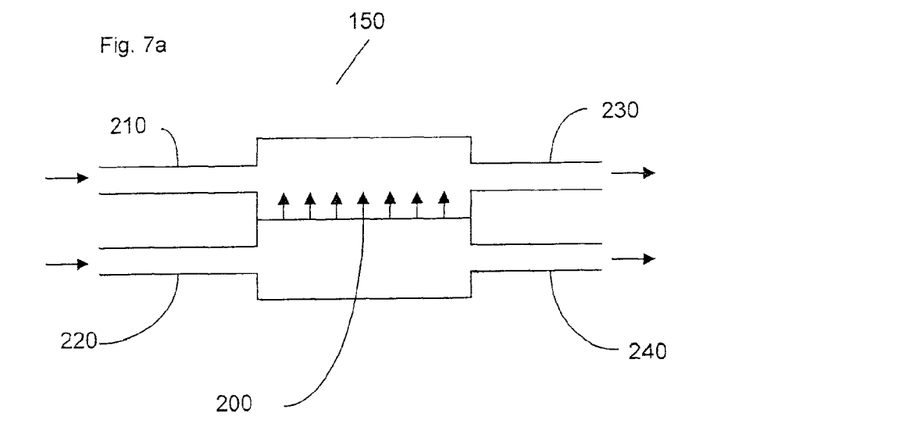
FIGS. 7a and b depict schematically a humidifying apparatus according to the present invention.
Figure 7B:
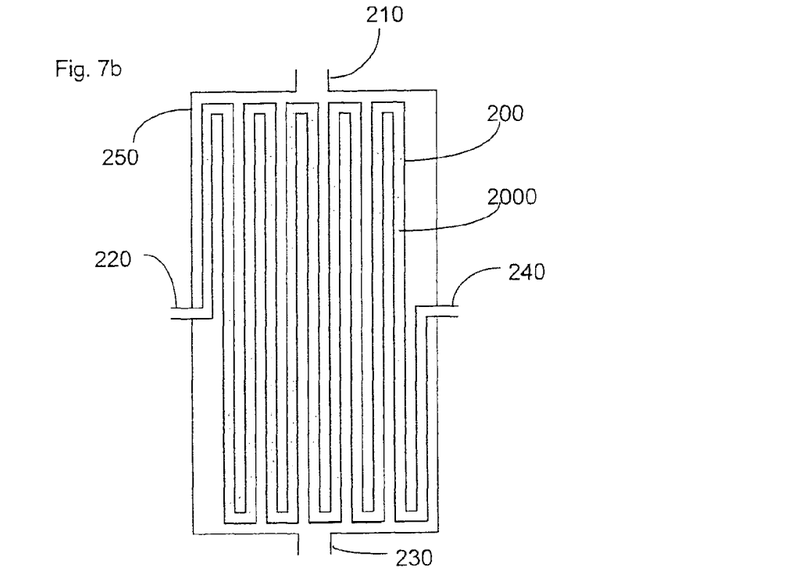
Figure 8:
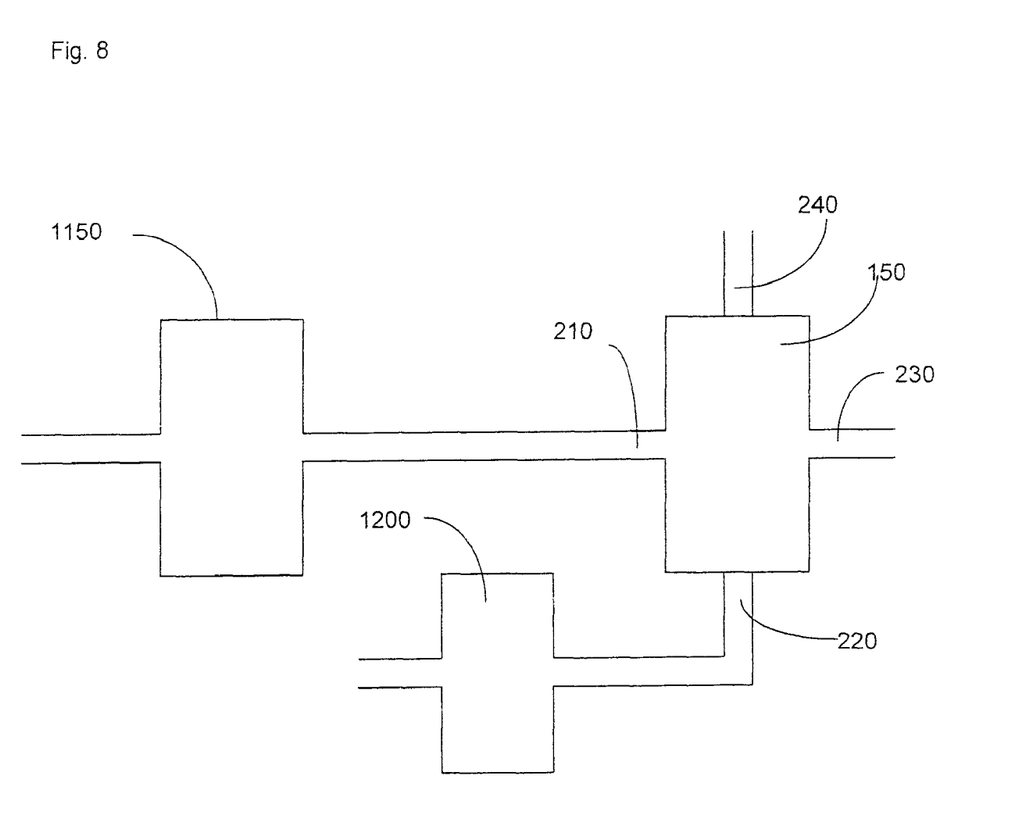
FIG. 8 illustrates a second embodiment of a humidifying apparatus according to the present invention.

FIGS. 7 and 8 illustrate humidifying apparatus 150 according to the present invention which may be used with the purge gas supply system of FIG. 6.

The basic arrangement of the humidifying apparatus 150 is illustrated in FIG. 7a and a more complex structure is illustrated in FIG. 7b which works on the same principles. In FIG. 7a the humidifying apparatus comprises a membrane 200 which behaves as if non-porous to the liquid with which the gas is to be humidified (usually (ultra pure) water) and porous to the vapour of that liquid. It should be possible to pressurize the water side of the membrane (though this is not necessary with a hydrophilic membrane as described below) and no water should pass through the membrane. One can also pressurize the gas side (at least using air or its components like nitrogen, oxygen etc.) and no gas will pass through the membrane either. The liquid wets the membrane material and then evaporates. The membrane allows only vapour of the liquid to pass and the liquid molecules can leave the membrane as they go into gas. A little gas may dissolve into the liquid from the gas side of the membrane but no bubbles form in the liquid. Thus, the membrane can be seen as porous to vapour of the liquid.

A first conduit 210 guides a gas to be humidified to one side of the membrane 200 and a second conduit 220 guides the liquid to humidify the gas to the other side of the membrane 200. As the gas is present on one side of the membrane 200 and the liquid on the other side of the membrane 200 vapour from the liquid will pass through the membrane 200 and humidify the gas. Preferably a flow of gas is provided past the membrane 200 so that a third conduit 230 is provided for guiding the gas which has been humidified away from the membrane 200 and a fourth conduit 240 is provided for guiding liquid away from the other side of the membrane 200.

A similar humidifying apparatus to this is disclosed in WO 2005/010619 and much of what is said in that application is applicable here in particular regarding the shape of the membrane, how it is connected etc. However, the major difference to what is disclosed in WO 2005/010619 is that the membrane of the present invention is provided with a liquidphilic surface. In other words, the liquid on the one side of the membrane 200 has a contact angle with the membrane of less than 90°, preferably less than 70°, more preferably less than 60°, yet more preferably less than 50° and most preferably less than 30° or even less than 20°.

One suitable class of material for use as the membrane are polymerized fluorinated sulfonic acid copolymers which are synthetic ionic polymers. The sulfonic acid groups are chemically active, but they are fixed within the polymer matrix. One such material has the following chemical formula:

The hydrophilic nature of the membrane could be provided, for example, through a coating (on one or both sides of the membrane) and/or through applying an electrical potential to the membrane, for example. These types of membranes have previously been used in steam purification systems such as those sold by Rasirc of San Diego, Calif., US under the trade name Intaeger.

The advantage of such a membrane is that a low pressure of liquid can be used on the liquid side of the membrane and there is better efficiency of gas side evaporation of the liquid i.e. there is greater mass transfer across the membrane. Furthermore, for hydrophilic membranes, it is not necessary to pressurize the water so that the actual hardware has considerably lower pressure drop off (factor of 10) compared to hydrophobic membranes. This characteristic is what makes the present invention feasible.

It is advantageous to maximize the surface area of membrane and a preferred embodiment is where the membrane is a hollow fibre with the liquid passing through the inside of the hollow fibre and the gas passing over the outside of the hollow fibre (though vice versa could be true also). One such embodiment is illustrated in FIG. 7b in which the liquid is provided through hollow fibre 2000 which is comprised of the membrane 200. Only one fibre is illustrated in FIG. 7b but of course the second conduit 220 could be connected to several fibres in parallel.

In the embodiment of FIG. 7b the gas enters a housing 250 which surrounds the hollow fibres 2000 and is passed over the fibres after being guided by conduit 210 into the housing and then, once humidified, the gas is guided out of the housing by third conduit 230.

In order to provide the flow of gas and flow of liquid, a liquid provider and gas provider are necessary. These could take the form, for example, of a pump providing the liquid and a compressed gas source.

FIG. 8 illustrates a second embodiment of humidifying apparatus in which the temperature of the gas leaving the humidifying apparatus 150 is controlled through careful control of the temperature of the liquid entering the humidifying apparatus 150 through second conduit 220. To this end the liquid is conditioned by a liquid conditioning apparatus 1200 prior to being supplied to the second conduit 220. The conditioning apparatus 1200 brings the temperature of the liquid to a desired temperature based on the input or output temperature of gas into or out of the humidifying apparatus 150. Therefore, the heat exchanger 126 of the purge gas supply system is not necessary as this function is automatically performed by the humidifying apparatus 150. The fourth conduit 240 may of course be provided back to the temperature conditioner 1200 so that the liquid is re-used. Alternatively, a heater similar to heater 126 of the purge gas supply system could be used either to heat the gas upstream or downstream of the membrane. Heating is required because of the loss in temperature on evaporation of the liquid.

Furthermore, the humidifying apparatus in FIG. 8 may be comprised of two modules. A local module comprises parts 150 and 1200 and these can be present only where a very high relative humidity of gas is required. Thus, the first conduit 210 can be provided with pre-humidified gas which has been humidified by apparatus 1150. This arrangement is particularly good because there can be a large pressure drop from where the gas is humidified to where it is actually used. If there is pressure drop, the humidity of a gas also decreases. Thus, providing the gas with high relative humidity locally using parts 150 and 1200 it is possible to place the module much closer to the exit for the gas so that the pressure drop between the humidifier and the exit hole is minimized. Furthermore, there are only a few modules which require extremely high humidity (97%) so that this way the energy used in achieving that humidity is decreased.

Humidifying apparatus 1150 may be any type of humidifying apparatus including, but not limited to a bubbling humidifying apparatus such as that disclosed in US 2005/0051739, or an apparatus such as that disclosed in WO 2005/010619 (i.e. a humidifier with a liquidphobic membrane) or may be a humidifier in accordance with the present invention and as illustrated in FIG. 7. The pre-humidifier provides humidified air to all modules (at about 40-45% relative humidity or at least less than 97% relative humidity) at a flow of about 400 liters per minute.

The humidifying apparatus 1150 may be common to the whole of the lithographic apparatus and only part of the gas provided by that apparatus is supplied to the humidifying apparatus 150, as required.

Typically the humidifying apparatus 1150 would provide gas of relative humidity of between 40 and 60% if the humidified air of the overall module is to be used in clean rooms. This could be increased to up to 80 or 90% (which is 60% after expansion at typical pressure drop between the modules). The gas then leaving the other humidifying apparatus 150 would have a relative humidity of at least 90%, preferably at least 97%.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

The invention claimed is:

1. A method comprising:
controlling the temperature of a liquid and providing that liquid to one side of a membrane;
pre-humidifying gas, by other than the membrane, prior to being provided to the other side of the membrane;
providing the pre-humidified gas to be humidified to the other side of the membrane, the pre-humidified gas provided to the other side of the membrane having a relative humidity greater than or equal to about 40%; and
humidifying the pre-humidified gas using the liquid via the membrane,
wherein the temperature of gas on the other side of the membrane is controlled by the temperature of liquid on the one side of the membrane, and wherein the controlling the temperature of the liquid comprises controlling the temperature of the liquid on the basis of gas temperature entering or leaving the other side of the membrane during the humidifying.

2. The method of claim 1, comprising conditioning the temperature of the liquid upstream of the membrane.

3. The method of claim 1, further comprising conditioning the temperature of the gas upstream and/or downstream of the membrane.

4. The method of claim 1, further comprising changing the temperature to which the liquid or gas is controlled.

5. The method of claim 1, further comprising projecting a patterned beam of radiation onto a radiation-sensitive substrate using a lithographic apparatus and blowing the humidified gas within the lithographic apparatus.

6. The method of claim 1, wherein the pre-humidified gas has a relative humidity greater than or equal to about 40% and less than 90%.

7. The method of claim 1, wherein the membrane has a surface which is liquidphilic to the liquid.

8. An apparatus comprising:
a membrane;
a liquid temperature conditioner to condition the temperature of a liquid;
a first conduit to guide the liquid from the liquid temperature conditioner to one side of the membrane;
a pre-humidifier, other than the membrane, to pre-humidify gas upstream of the membrane;
a second conduit to guide the pre-humidified gas, to be humidified via the membrane, to contact the membrane at the other side of the membrane, wherein the pre-humidified gas that contacts the membrane has a relative humidity greater than or equal to about 40%; and
a controller to control the temperature of the gas by controlling the liquid temperature conditioner to control the temperature of the liquid, wherein the controller is configured to control the temperature of the liquid on the basis of gas temperature entering or leaving the other side of the membrane during the humidification of the gas.

9. The apparatus of claim 8, further comprising a gas temperature conditioner to condition the temperature of the gas upstream and/or downstream of the membrane.

10. The apparatus of claim 8, wherein the controller is configured to control the liquid temperature conditioner to change the temperature to which the liquid or gas is conditioned.

11. The apparatus of claim 8, wherein the liquid temperature conditioner is configured to receive control signals indicative of a desired temperature of the liquid based on a desired temperature of the gas.

12. The apparatus of claim 8, wherein the temperature of the gas is the temperature of gas leaving the other side of the membrane.

13. The apparatus of claim 8, further comprising a lithographic apparatus configured to project a patterned beam of radiation onto a radiation-sensitive substrate, the lithographic apparatus comprising a purging system to blow humidified gas from the other side of the membrane within the lithographic apparatus.

14. The apparatus of claim 13, wherein the lithographic apparatus is an immersion lithographic apparatus configured to project the patterned beam of radiation through immersion liquid onto the radiation-sensitive substrate and the purging system is selected from: a liquid confinement system to confine the immersion liquid, a drying station to dry the immersion liquid from an object, or an evaporation reducing system to reduce evaporation of the immersion liquid from an object.

15. The apparatus of claim 8, wherein the pre-humidifier is configured to provide pre-humidified gas having a relative humidity greater than or equal to about 40% and less than 90%.

16. The apparatus of claim 8, comprising a first outlet for the pre-humidified gas with a relative humidity greater than or equal to about 40% and less than 90% and a second outlet for the gas humidified by the membrane with a relative humidity greater than or equal to 90%.

17. The apparatus of claim 8, wherein the membrane behaves in a non-porous manner with regard to the liquid such that the liquid does not enter the membrane, and in a porous manner with regard to the vapor of the liquid.

18. An apparatus comprising:
- a liquid temperature conditioner to condition the temperature of a liquid;
- a membrane having a surface which is liquidphilic to the liquid;
- a first conduit to guide the liquid from the liquid temperature conditioner to one side of the membrane;
- a pre-humidifier, other than the membrane, to pre-humidify gas upstream of the membrane;
- a second conduit to guide the pre-humidified gas, to be humidified via the membrane, to contact the membrane at the other side of the membrane, wherein the pre-humidified gas that contacts the membrane has a relative humidity greater than or equal to about 40%; and
- a controller to control the temperature of the gas by controlling the liquid temperature conditioner to control the temperature of the liquid, wherein the controller is configured to control the temperature of the liquid on the basis of gas temperature entering or leaving the one side of the membrane during the humidification of the gas.

19. The apparatus of claim 18, further comprising a lithographic apparatus configured to project a patterned beam of radiation onto a radiation-sensitive substrate, the lithographic apparatus comprising a purging system to blow humidified gas from the other side of the membrane within the lithographic apparatus.

20. The apparatus of claim 19, wherein the lithographic apparatus is an immersion lithographic apparatus configured to project the patterned beam of radiation through immersion liquid onto the radiation-sensitive substrate and the purging system is selected from: a liquid confinement system to confine the immersion liquid, a drying station to dry the immersion liquid from an object, or an evaporation reducing system to reduce evaporation of the immersion liquid from an object.

* * * * *